United States Patent
Popovich et al.

(10) Patent No.: US 11,373,908 B2
(45) Date of Patent: Jun. 28, 2022

(54) HIGH EFFICIENCY DIE DICING AND RELEASE

(71) Applicant: 3D Glass Solutions, Inc., Albuquerque, NM (US)

(72) Inventors: Mark Popovich, Placitas, NM (US); Roger Cook, Albuquerque, NM (US); Jeb H. Flemming, Albuquerque, NM (US); Sierra D. Jarrett, Albuquerque, NM (US); Jeff Bullington, Orlando, FL (US); Carrie F. Schmidt, Las Lunas, NM (US); Luis C. Chenoweth, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 0 days.

(21) Appl. No.: 17/601,997

(22) PCT Filed: Apr. 16, 2020

(86) PCT No.: PCT/US2020/028474
§ 371 (c)(1),
(2) Date: Oct. 7, 2021

(87) PCT Pub. No.: WO2020/214788
PCT Pub. Date: Oct. 22, 2020

(65) Prior Publication Data
US 2022/0093465 A1    Mar. 24, 2022

Related U.S. Application Data

(60) Provisional application No. 62/835,743, filed on Apr. 18, 2019.

(51) Int. Cl.
*H01L 21/78*    (2006.01)
*H01L 23/13*    (2006.01)
(Continued)

(52) U.S. Cl.
CPC .......... *H01L 21/78* (2013.01); *H01L 21/4846* (2013.01); *H01L 23/13* (2013.01); *H01L 23/15* (2013.01); *H01L 23/49838* (2013.01)

(58) Field of Classification Search
CPC ........ H01L 21/78; C03C 25/62; C03C 3/095; C03C 3/108; C03C 4/04; C03C 15/00;
(Continued)

(56) References Cited

U.S. PATENT DOCUMENTS

| 2,515,940 A | 7/1950 | Stookey |
| 2,515,941 A | 7/1950 | Stookey |

(Continued)

FOREIGN PATENT DOCUMENTS

| CN | 1562831 A | 4/2004 |
| CN | 105938928 | 9/2016 |

(Continued)

OTHER PUBLICATIONS

International Search Report and Written Opinion for PCT/US2017/026662 dated Jun. 5, 2017, 11 pp.

(Continued)

*Primary Examiner* — Vu A Vu
(74) *Attorney, Agent, or Firm* — Edwin S. Flores; Chalker Flores, LLP

(57) ABSTRACT

A method of batch massively parallel die release of a die from a substrate enabling low cost mass production of with passive, system in package (SiP) or system-in-a-package, or systems-on-chip (SoC), filters and/or other devices from a glass substrate.

22 Claims, 2 Drawing Sheets

(51) Int. Cl.
  *H01L 23/498* (2006.01)
  *H01L 23/15* (2006.01)
  *H01L 21/48* (2006.01)

(58) Field of Classification Search
  CPC . C03C 23/002; C03C 23/007; C03C 2218/34; B32B 3/10; Y10T 428/24479
  USPC ........................................................ 438/464
  See application file for complete search history.

(56) References Cited

U.S. PATENT DOCUMENTS

| | | | |
|---|---|---|---|
| 2,628,160 A | 2/1953 | Stookey | |
| 2,684,911 A | 7/1954 | Stookey | |
| 2,971,853 A | 2/1961 | Stookey | |
| 3,281,264 A | 10/1966 | Cape et al. | |
| 3,904,991 A | 9/1975 | Ishli et al. | |
| 3,985,531 A | 10/1976 | Grossman | |
| 3,993,401 A | 12/1976 | Strehlow | |
| 4,029,605 A | 6/1977 | Kosiorek | |
| 4,131,516 A | 12/1978 | Bakos et al. | |
| 4,413,061 A | 11/1983 | Kumar | |
| 4,444,616 A | 4/1984 | Fujita et al. | |
| 4,514,053 A | 4/1985 | Borrelli et al. | |
| 4,537,612 A | 8/1985 | Borrelli et al. | |
| 4,647,950 A | 3/1987 | Traut et al. | |
| 4,692,015 A | 9/1987 | Loce et al. | |
| 4,788,165 A | 11/1988 | Fong et al. | |
| 4,942,076 A | 7/1990 | Panicker et al. | |
| 5,078,771 A | 1/1992 | Wu | |
| 5,147,740 A | 9/1992 | Robinson | |
| 5,212,120 A | 5/1993 | Araujo et al. | |
| 5,215,610 A | 6/1993 | Dipaolo et al. | |
| 5,352,996 A | 10/1994 | Kawaguchi | |
| 5,371,466 A | 12/1994 | Arakawa et al. | |
| 5,374,291 A | 12/1994 | Yabe et al. | |
| 5,395,498 A | 3/1995 | Gombinsky et al. | |
| 5,409,741 A | 4/1995 | Laude | |
| 5,733,370 A | 3/1998 | Chen et al. | |
| 5,779,521 A | 7/1998 | Muroyama et al. | |
| 5,850,623 A | 12/1998 | Carman, Jr. et al. | |
| 5,902,715 A | 5/1999 | Tsukamoto et al. | |
| 5,919,607 A | 7/1999 | Lawandy et al. | |
| 5,998,224 A | 12/1999 | Rohr et al. | |
| 6,066,448 A | 5/2000 | Wohlstadter et al. | |
| 6,094,336 A | 7/2000 | Weekamp | |
| 6,136,210 A | 10/2000 | Biegelsen et al. | |
| 6,171,886 B1 | 1/2001 | Ghosh | |
| 6,258,497 B1 | 7/2001 | Kropp et al. | |
| 6,287,965 B1 | 9/2001 | Kang et al. | |
| 6,329,702 B1 | 12/2001 | Gresham et al. | |
| 6,373,369 B2 | 4/2002 | Huang et al. | |
| 6,383,566 B1 | 5/2002 | Zagdoun | |
| 6,485,690 B1 | 11/2002 | Pfost et al. | |
| 6,495,411 B1 | 12/2002 | Mei | |
| 6,511,793 B1 | 1/2003 | Cho et al. | |
| 6,514,375 B2 | 2/2003 | Kijima | |
| 6,562,523 B1 | 2/2003 | Wu et al. | |
| 6,678,453 B2 | 1/2004 | Bellman et al. | |
| 6,686,824 B1 | 2/2004 | Yamamoto et al. | |
| 6,771,860 B2 | 8/2004 | Trezza et al. | |
| 6,783,920 B2 | 8/2004 | Livingston et al. | |
| 6,824,974 B2 | 11/2004 | Pisharody et al. | |
| 6,843,902 B1 | 1/2005 | Penner et al. | |
| 6,875,544 B1 | 4/2005 | Sweatt et al. | |
| 6,932,933 B2 | 8/2005 | Helvajian et al. | |
| 6,977,722 B2 | 12/2005 | Wohlstadter et al. | |
| 7,033,821 B2 | 4/2006 | Kim et al. | |
| 7,064,045 B2 * | 6/2006 | Yang ................... | B81C 1/00333 257/E21.122 |
| 7,132,054 B1 | 11/2006 | Kravitz et al. | |
| 7,179,638 B2 | 2/2007 | Anderson | |
| 7,277,151 B2 | 10/2007 | Ryu et al. | |
| 7,306,689 B2 | 12/2007 | Okubora et al. | |
| 7,326,538 B2 | 2/2008 | Pitner et al. | |
| 7,407,768 B2 | 8/2008 | Yamazaki et al. | |
| 7,410,763 B2 | 8/2008 | Su et al. | |
| 7,439,128 B2 | 10/2008 | Divakaruni | |
| 7,470,518 B2 | 12/2008 | Chiu et al. | |
| 7,497,554 B2 | 3/2009 | Okuno | |
| 7,603,772 B2 | 10/2009 | Farnworth et al. | |
| 7,948,342 B2 | 5/2011 | Long | |
| 8,062,753 B2 | 11/2011 | Schreder et al. | |
| 8,076,162 B2 | 12/2011 | Flemming et al. | |
| 8,096,147 B2 | 1/2012 | Flemming et al. | |
| 8,361,333 B2 * | 1/2013 | Flemming ............ | C03C 23/007 216/31 |
| 8,492,315 B2 | 7/2013 | Flemming et al. | |
| 8,709,702 B2 | 4/2014 | Flemming et al. | |
| 9,385,083 B1 | 7/2016 | Herrault et al. | |
| 9,449,753 B2 | 9/2016 | Kim | |
| 9,635,757 B1 | 4/2017 | Chen et al. | |
| 9,755,305 B2 | 9/2017 | Desclos et al. | |
| 9,819,991 B1 | 11/2017 | Rajagopalan et al. | |
| 10,070,533 B2 | 9/2018 | Flemming et al. | |
| 10,201,901 B2 | 2/2019 | Flemming et al. | |
| 2001/0051584 A1 | 12/2001 | Harada et al. | |
| 2002/0015546 A1 | 2/2002 | Bhagavatula | |
| 2002/0086246 A1 | 7/2002 | Lee | |
| 2002/0100608 A1 | 8/2002 | Fushie et al. | |
| 2003/0025227 A1 | 2/2003 | Daniell | |
| 2003/0124716 A1 | 7/2003 | Hess et al. | |
| 2003/0135201 A1 | 7/2003 | Gonnelli | |
| 2003/0156819 A1 | 8/2003 | Pruss et al. | |
| 2003/0174944 A1 | 9/2003 | Dannoux | |
| 2003/0228682 A1 | 12/2003 | Lakowicz et al. | |
| 2003/0231830 A1 | 12/2003 | Hikichi | |
| 2004/0008391 A1 | 1/2004 | Bowley et al. | |
| 2004/0020690 A1 | 2/2004 | Parker et al. | |
| 2004/0155748 A1 | 8/2004 | Steingroever | |
| 2004/0171076 A1 | 9/2004 | Dejneka et al. | |
| 2004/0184705 A1 | 9/2004 | Shimada et al. | |
| 2004/0198582 A1 | 10/2004 | Borrelli et al. | |
| 2004/0227596 A1 | 11/2004 | Nguyen et al. | |
| 2005/0089901 A1 | 4/2005 | Porter et al. | |
| 2005/0105860 A1 | 5/2005 | Oono | |
| 2005/0150683 A1 | 7/2005 | Farnworth et al. | |
| 2005/0170670 A1 | 8/2005 | King et al. | |
| 2005/0212432 A1 | 9/2005 | Neil et al. | |
| 2005/0277550 A1 | 12/2005 | Brown et al. | |
| 2006/0092079 A1 | 5/2006 | Rochemont | |
| 2006/0118965 A1 | 6/2006 | Matsui | |
| 2006/0147344 A1 | 7/2006 | Ahn et al. | |
| 2006/0158300 A1 | 7/2006 | Korony et al. | |
| 2006/0159916 A1 | 7/2006 | Dubrow et al. | |
| 2006/0171033 A1 | 8/2006 | Shreder et al. | |
| 2006/0177855 A1 | 8/2006 | Utermohlen et al. | |
| 2006/0188907 A1 | 8/2006 | Lee et al. | |
| 2006/0193214 A1 | 8/2006 | Shimano et al. | |
| 2006/0283948 A1 | 12/2006 | Naito | |
| 2007/0120263 A1 | 5/2007 | Gabric et al. | |
| 2007/0121263 A1 | 5/2007 | Liu et al. | |
| 2007/0155021 A1 | 7/2007 | Zhang et al. | |
| 2007/0158787 A1 | 7/2007 | Chanchani | |
| 2007/0248126 A1 | 10/2007 | Liu et al. | |
| 2007/0267708 A1 | 11/2007 | Courcimault | |
| 2007/0272829 A1 | 11/2007 | Nakagawa et al. | |
| 2007/0279837 A1 | 12/2007 | Chow et al. | |
| 2007/0296520 A1 | 12/2007 | Hosokawa et al. | |
| 2008/0136572 A1 | 6/2008 | Ayasi et al. | |
| 2008/0174976 A1 | 7/2008 | Satoh et al. | |
| 2008/0182079 A1 | 7/2008 | Mirkin et al. | |
| 2008/0223603 A1 | 9/2008 | Kim et al. | |
| 2008/0226228 A1 | 9/2008 | Tamurar | |
| 2008/0245109 A1 | 10/2008 | Flemming et al. | |
| 2008/0291442 A1 | 11/2008 | Lawandy | |
| 2008/0305268 A1 | 12/2008 | Norman et al. | |
| 2008/0316678 A1 | 12/2008 | Ehrenberg et al. | |
| 2009/0029185 A1 | 1/2009 | Lee et al. | |
| 2009/0075478 A1 | 3/2009 | Matsui | |
| 2009/0130736 A1 | 5/2009 | Collis et al. | |
| 2009/0170032 A1 | 7/2009 | Takahashi et al. | |
| 2009/0182720 A1 | 7/2009 | Cain et al. | |
| 2009/0243783 A1 | 10/2009 | Fouquet et al. | |

(56) References Cited

U.S. PATENT DOCUMENTS

| | | |
|---|---|---|
| 2010/0022416 A1 | 1/2010 | Flemming et al. |
| 2010/0059265 A1 | 3/2010 | Kim |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0108525 A1 | 5/2011 | Chien et al. |
| 2011/0170273 A1 | 7/2011 | Helvajian |
| 2011/0195360 A1 | 8/2011 | Flemming et al. |
| 2011/0217657 A1* | 9/2011 | Flemming ............... G03F 7/20 430/270.1 |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0119401 A1 | 5/2013 | D'evelyn et al. |
| 2013/0142998 A1 | 6/2013 | Flemming et al. |
| 2013/0183805 A1 | 7/2013 | Wong et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1* | 2/2014 | Shenoy ............... H01L 23/5389 345/501 |
| 2014/0070380 A1 | 3/2014 | Chiu et al. |
| 2014/0104284 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1* | 9/2014 | Dillion ................. G03F 7/0043 430/13 |
| 2014/0367695 A1 | 12/2014 | Barlow |
| 2015/0048901 A1 | 2/2015 | Rogers |
| 2015/0071593 A1 | 3/2015 | Kanke |
| 2015/0210074 A1 | 7/2015 | Chen et al. |
| 2015/0263429 A1 | 9/2015 | Vahidpour et al. |
| 2015/0277047 A1 | 10/2015 | Flemming et al. |
| 2016/0048079 A1 | 2/2016 | Lee et al. |
| 2016/0152505 A1* | 6/2016 | Fushie .................... C03B 11/08 65/33.1 |
| 2016/0181211 A1 | 6/2016 | Kamagin et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0213762 A1 | 4/2017 | Flemming et al. |
| 2018/0323485 A1 | 11/2018 | Gnanou et al. |
| 2019/0280079 A1 | 7/2019 | Bouvier et al. |
| 2020/0235020 A1* | 7/2020 | Boek ....................... H01L 23/15 |
| 2020/0275558 A1 | 8/2020 | Fujita |

FOREIGN PATENT DOCUMENTS

| | | |
|---|---|---|
| CN | 210668058 U | 6/2020 |
| DE | 102004059252 A1 | 1/2006 |
| EP | 0311274 A2 | 12/1989 |
| EP | 0507719 A1 | 10/1992 |
| EP | 0685857 B1 | 12/1995 |
| EP | 0949648 A1 | 10/1999 |
| EP | 1487019 A1 | 12/2004 |
| EP | 1683571 A1 | 6/2006 |
| JP | 56-155587 | 12/1981 |
| JP | 61149905 | 7/1986 |
| JP | 61231529 A | 10/1986 |
| JP | 62202840 | 9/1987 |
| JP | 63-128699 A | 6/1988 |
| JP | H393683 A | 4/1991 |
| JP | 05139787 A | 6/1993 |
| JP | 08179155 | 12/1994 |
| JP | 08026767 | 1/1996 |
| JP | H10007435 A | 1/1998 |
| JP | 10199728 A | 7/1998 |
| JP | 11344648 A | 12/1999 |
| JP | 2000228615 A | 8/2000 |
| JP | 2001033664 A | 2/2001 |
| JP | 2005302987 A | 10/2005 |
| JP | 2005215644 | 11/2005 |
| JP | 2006179564 A | 6/2006 |
| JP | 2008252797 A | 10/2008 |
| JP | 2012079960 A | 4/2012 |
| JP | 2013062473 A | 4/2013 |
| JP | 2013217989 A | 10/2013 |
| JP | 2014241365 A | 12/2014 |
| JP | 2015028651 A | 2/2015 |
| JP | H08026767 A | 1/2016 |
| JP | 2018200912 A | 12/2018 |
| KR | 100941691 A | 2/2010 |
| KR | 101167691 B1 | 7/2012 |
| WO | 2007088058 A1 | 8/2007 |
| WO | 2008119080 A1 | 10/2008 |
| WO | 2008154931 A1 | 12/2008 |
| WO | 2009029733 A2 | 3/2009 |
| WO | 2009062011 A1 | 5/2009 |
| WO | 2009126649 A2 | 10/2009 |
| WO | 2010011939 A2 | 1/2010 |
| WO | 2011100445 A1 | 8/2011 |
| WO | 2011109648 A1 | 9/2011 |
| WO | 2012078213 A1 | 6/2012 |
| WO | 2014043267 A1 | 3/2014 |
| WO | 2014062226 A1 | 4/2014 |
| WO | 2014062311 A2 | 4/2014 |
| WO | 2015108648 A1 | 7/2015 |

OTHER PUBLICATIONS

International Search Report and Written Opinion for PCT/US2018/029559 dated Aug. 3, 2018, 9 pp.
International Search Report and Written Opinion for PCT/US2018/039841 dated Sep. 20, 2018 by Australian Patent Office, 12 pp.
International Search Report and Written Opinion for PCT/US2018/065520 dated Mar. 20, 2019 by Australian Patent Office, 11 pp.
International Search Report and Written Opinion for PCT/US2018/068184 dated Mar. 19, 2019 by Australian Patent Office, 11 pp.
International Search Report and Written Opinion for PCT/US2019/024496 dated Jun. 20, 2019 by Australian Patent Office, 9 pp.
International Search Report and Written Opinion for PCT/US2019/34245 dated Aug. 9, 2019 by Australian Patent Office, 10 pp.
International Search Report and Written Opinion for PCT/US2019/50644 dated Dec. 4, 2019 by USPTO, 9 pp.
International Search Report and Written Opinion for PCT/US2019/068586 dated Mar. 12, 2020 by USPTO, 10 pp.
International Search Report and Written Opinion for PCT/US2019/068590 dated Mar. 5, 2020 by USPTO, 9 pp.
International Search Report and Written Opinion for PCT/US2019/068593 dated Mar. 16, 2020 by USPTO, 8 pp.
International Search Report and Written Opinion for PCT/US2020/026673 dated Jun. 22, 2020, by the USPTO, 13 pp.
International Search Report and Written Opinion for PCT/US2020/28474 dated Jul. 17, 2020 by the USPTO, 7 pp.
International Search Report and Written Opinion for PCT/US2020/54394 dated Jan. 7, 2021 by the USPTO, 15 pp.
International Search Report and Written Opinion for PCT/US2021/21371 dated May 20, 2021 by the USPTO, 10 pp.
International Search Report and Written Opinion for PCT/US2021/27499 dated Jun. 16, 2021 by the USPTO, 7 pp.
International Technology Roadmap for Semiconductors, 2007 Edition, "Assembly and Packaging," 9 pages.

(56) References Cited

OTHER PUBLICATIONS

Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.
Lakowicz, et al.; "Advances in Surface-Enhanced Fluorescence", J Fluorescence, (2004), 14:425-441.
Lewis, Sr., "Hawley's Condensed Chemical Dictionary." 13th ed, 1997, John Wiley and Sons. p. 231.
Lin, C.H., et al., "Fabrication of Microlens Arrays in Photosensitive Glass by Femtosecond Laser Direct Writing," Appl Phys A (2009) 97:751-757.
Livingston, F.E., et al., "Effect of Laser Parameters on the Exposure and Selective Etch Rate in Photostructurable Glass," SPIE vol. 4637 (2002); pp. 404-412.
Lyon, L.A., et al., "Raman Spectroscopy," Anal Chem (1998), 70:341R-361R.
Mohamedelhassan, A., "Fabrication of Ridge Waveguides in Lithium Niobate," Independent thesis Advanced level, KTH, School of Engineering Sciences, Physics, 2012, 68 pp.
Muharram, B., Thesis from University of Calgary Graduate Studies, "Substrate-Integrated Waveguide Based Antenna in Remote Respiratory Sensing," 2012, 97 pp.
Papapolymerou, I., et al., "Micromachined patch antennas," IEEE Transactions on Antennas and Propagation, vol. 46, No. 2, 1998, pp. 275-283.
Perro, A., et al., "Design and synthesis of Janus micro- and nanoparticles," J Mater Chem (2005), 15:3745-3760.
Quantum Leap, "Liquid Crystal Polymer (LCP) LDMOS Packages," Quantum Leap Datasheet, (2004), miconnelly.com/QLPKG.Final_LDMOS_DataSheet.pdf, 2 pages.
Scrantom, Charles Q., "LTCC Technology—Where We Are and Where We're Going—IV," Jun. 2000, 12 pages.
TechNote #205, Bangs Laboratories, www.bangslabs.com/technotes/205.pdf, "Covalent Coupling".
TechNote #104, Bangs Laboratories, www.bangslabs.com/technotes/104.pdf, "Silica Microspheres".
TechNote #201, Bangs Laboratories, www.bangslabs.com/technotes/201.pdf, "Working with Microspheres".
Topper, et al., "Development of a high density glass interposer based on wafer level packaging technologies," 2014 IEEE 64th Electronic Components and Technology Conference, May 27, 2014, pp. 1498-1503.
Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.
Zhang, H., et al., "Biofunctionalized Nanoarrays of Inorganic Structures Prepared by Dip-Pen Nanolithography," Nanotechnology (2003), 14:1113-1117.
Zhang, H., et al., Synthesis of Hierarchically Porous Silica and Metal Oxide Beads Using Emulsion-Templated Polymer Scaffolds, Chem Mater (2004), 16:4245-4256.
Aslan, et al., "Metal-Enhanced Fluorescence: an emerging tool in biotechnology" Current opinion in Biotechnology (2005), 16:55-62.
Azad, I., et al., "Design and Performance Analysis of 2.45 GHz Microwave Bandpass Filter with Reduced Harmonics," International Journal of Engineering Research and Development (2013), 5(11 ):57-67.
Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.
Beke, S., et al., "Fabrication of Transparent and Conductive Microdevices," Journal of Laser Micro/Nanoengineering (2012), 7(1):28-32.
Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.
Cheng, et al. "Three-dimensional Femtosecond Laser Integration in Glasses" The Review of Laser Engineering, vol. 36, 2008, pp. 1206-1209, Section 2, Subsection 3.1.
Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.
Chowdhury, et al, "Metal-Enhanced Chemiluminescence", J Fluorescence (2006), 16:295-299.
Crawford, Gregory P., "Flexible Flat Panel Display Technology," John Wiley and Sons, NY, (2005), 9 pages.
Dang, et al. "Integrated thermal-fluidic I/O interconnects for an on-chip microchannel heat sink," IEEE Electron Device Letters, vol. 27, No. 2, pp. 117-119, 2006.
Dietrich, T.R., et al., "Fabrication Technologies for Microsystems Utilizing Photoetchable Glass," Microelectronic Engineering 30, (1996), pp. 407-504.
Extended European Search Report 15741032.5 dated Aug. 4, 2017, 11 pp.
Extended European Search Report 15789595.4 dated Mar. 31, 2017, 7 pp.
Extended European Search Report 17757365.6 dated Oct. 14, 2019, 14 pp.
Extended European Search Report 17744848.7 dated Oct. 30, 2019, 9 pp.
European Search Report and Supplemental European Search Report for EP 18828907 dated Mar. 25, 2020, 11 pp.
European Search Report and Supplemental European Search Report for EP 18889385.3 dated Dec. 2, 2020, 8 pp.
European Search Report and Supplemental European Search Report for EP 18898912.3 dated Feb. 2, 2021, 10 pp.
European Search Report and Supplemental European Search Report for EP 19784673.6 dated Feb. 2, 2021, 8 pp.
European Search Report and Supplemental European Search Report for EP 19811031.4 dated Feb. 26, 2021, 7 pp.
Geddes, et al., "Metal-Enhanced Fluorescence" J Fluorescence, (2002), 12:121-129.
Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.
Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.
Grine, F. et al., "High-Q Substrate Integrated Waveguide Resonator Filter With Dielectric Loading," IEEE Access vol. 5, Jul. 12, 2017, pp. 12526-12532.
Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.
Intel Corporation, "Intel® 82566 Layout Checklist (version 1.0)", 2006.
International Search Report and Written Opinion for PCT/US2008/058783 dated Jul. 1, 2008, 15 pp.
International Search Report and Written Opinion for PCT/US2008/074699 dated Feb. 26, 2009, 11 pp.
International Search Report and Written Opinion for PCT/US2009/039807 dated Nov. 24, 2009, 13 pp.
International Search Report and Written Opinion for PCT/US2009/051711 dated Mar. 5, 2010, 15 pp.
International Search Report and Written Opinion for PCT/US2011/024369 dated Mar. 25, 2011, 13 pp.
International Search Report and Written Opinion for PCT/US2013/059305 dated Jan. 10, 2014, 6 pp.
International Search Report and Written Opinion for PCT/US2015/012758 dated Apr. 8, 2015, 11 pp.
International Search Report and Written Opinion for PCT/US2015/029222 dated Jul. 22, 2015, 9 pp.
International Search Report and Written Opinion for PCT/US2017/019483 dated May 19, 2017, 11 pp.

(56) References Cited

OTHER PUBLICATIONS

Extended European Search Report for EP 19906040.1 dated Feb. 4, 2022, 16 pp.

* cited by examiner

HIGH EFFICIENCY DIE DICING AND RELEASE

CROSS-REFERENCE TO RELATED APPLICATIONS

This application is the National Stage of International Application No. PCT/US2020/028474, filed on 16 Apr. 2020 claiming the priority to U.S. Provisional Application No. 62/835,743 filed on 18 Apr. 2019, the contents of each of which are incorporated by reference herein.

TECHNICAL FIELD OF THE INVENTION

The present invention relates to methods for dicing and/or releasing a die from a wafer.

BACKGROUND OF THE INVENTION

Without limiting the scope of the invention, its background is described in connection with a method to dicing and/or release of a die from a wafer.

The die size with VLSI technology has enabled larger die size with greater complexity yielding greater processing power CPUs and higher density memory devices. The large die and large market demand has led to larger area wafers to reduce the cost per die, while improving performance. The removal or dicing of die from the wafer is considered an incremental cost to the overall cost of the final product. However, advancements in the integration of passive devices using thin film and thick film process by a combination of additive and subtractive processes. This has the ability to create thousands to tens of thousands of passive device and filters and combination of devices on a single substrate. Classic dicing, using serial processing such as laser scribing, sawing or water jet tools, takes too long (up to tens of hours) and has a dramatic impact on the cost to produce passive or other fine featured devices.

What is needed are better and faster methods for the removal or dicing of die from the wafer.

SUMMARY OF THE INVENTION

The inventors have demonstrated a parallel and batch process to remove die from a substrate that dramatically reduces the cost and improves yield, while increasing the die count per substrate.

In one embodiment, the present invention includes a method of creating a die release or scribe pattern for one or more dies in parallel batch process from a substrate comprising, consisting of, or consisting essentially of: exposing at least one portion of a photosensitive glass substrate with the die release or scribe pattern with an activating UV energy source; heating the photosensitive glass substrate to a heating phase for at least ten minutes above its glass transition temperature; cooling the photosensitive glass substrate to transform at least part of the exposed photosensitive glass substrate to a crystalline material to form a glass-ceramic crystalline substrate; coating an exposed region with a UV light blocking layer; creating a passive component, filter, or other device to completion on a front of the substrate; and etching away a ceramic phase of the die release or scribe pattern in the photosensitive glass substrate with an etchant solution to release the die from the substrate. In one aspect, the die release scribe pattern is a rectangular, circular, elliptical, fractal or another shape that outlines a shape of the passive component, filter, or other device. In another aspect, the die release scribe pattern is etched through to an adhesive backing. In another aspect, the die release scribe pattern is greater than a 5 μm and 250 μm wide structure. In another aspect, the die release scribe pattern has a greater number of die per substrate than an equivalent substrate cut mechanically. In another aspect, an edge of the released die has a surface roughness less than 5 μm. In another aspect, an edge of the released die has a surface roughness less than 1 μm. In another aspect, an edge of the released die has a non-normal angle from a surface of the die. In another aspect, an edge of the released die has a non-normal angle from a surface of the die that is at least 1° and less than 30° from Normal to the surface of the die. In another aspect, a top or bottom corner of the released die has a non-normal curvature from a surface of the die that is at least 1° to less than 30° from a surface of the die. In another aspect, a width of one or more scribe lines is 10, 20, 30, 40, 50, 60, 70, 75, 80, or 90 μm wide, or ranges in between.

In one embodiment, the present invention includes a method of creating a die release or scribe pattern for one or more dies in parallel batch process from a substrate comprising, consisting of, or consisting essentially of: masking a photosensitive glass substrate with the die release or scribe pattern; exposing at least one portion of the photosensitive glass substrate as a die release with an activating UV energy source; heating the photosensitive glass substrate to a heating phase of at least ten minutes above its glass transition temperature; cooling the photosensitive glass substrate to transform at least part of the exposed photosensitive glass substrate to form a glass-ceramic crystalline portion of the photosensitive glass substrate; coating an exposed region with a UV light blocking layer; creating a passive component, filter, or other device to completion; placing a weakly adhesive backing to a back side of the substrate; etching away the glass-ceramic portion of the die release or scribe pattern in the photosensitive glass substrate with an etchant solution that releases the die; and removing the one or more dies from the weakly adhesive backing. In one aspect, the die release or scribe pattern is a rectangular, circular, elliptical, fractal or another shape that outlines a shape of the passive component, filter, or other device. In another aspect, the die release scribe pattern is a can etch to the adhesive backing. In another aspect, the die release scribe pattern can be greater than 5 μm and 250 μm wide structure. In another aspect, the die release scribe pattern enables a greater number of die per substrate. In another aspect, an edge of the released die has a surface roughness less than 5 μm. In another aspect, an edge of the released die has a surface roughness less than 1 μm. In another aspect, an edge of the released die has a non-normal angle from a surface of the die. In another aspect, an edge of the released die has a non-normal angle from a surface of at least 1° is and less than 30° from Normal to the surface of the die. In another aspect, a top or bottom corner of the released die has a non-normal curvature from the surface of at least 1° is and less than 30° from the surface of the die. In another aspect, a width of one or more scribe lines is 10, 20, 30, 40, 50, 60, 70, 75, 80, or 90 μm wide, or ranges in between.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
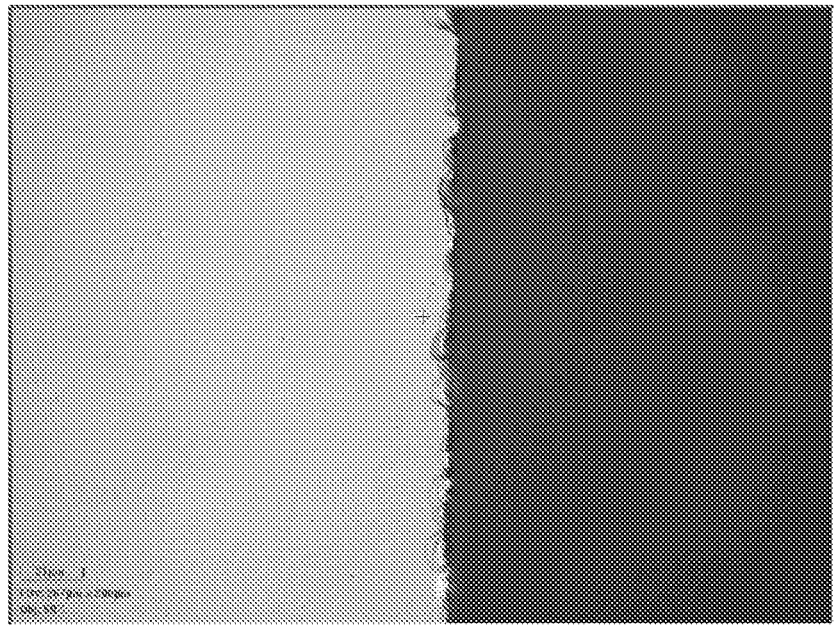
FIG. 1 is a side view of the sidewall of a sawed trench.
Figure 2:
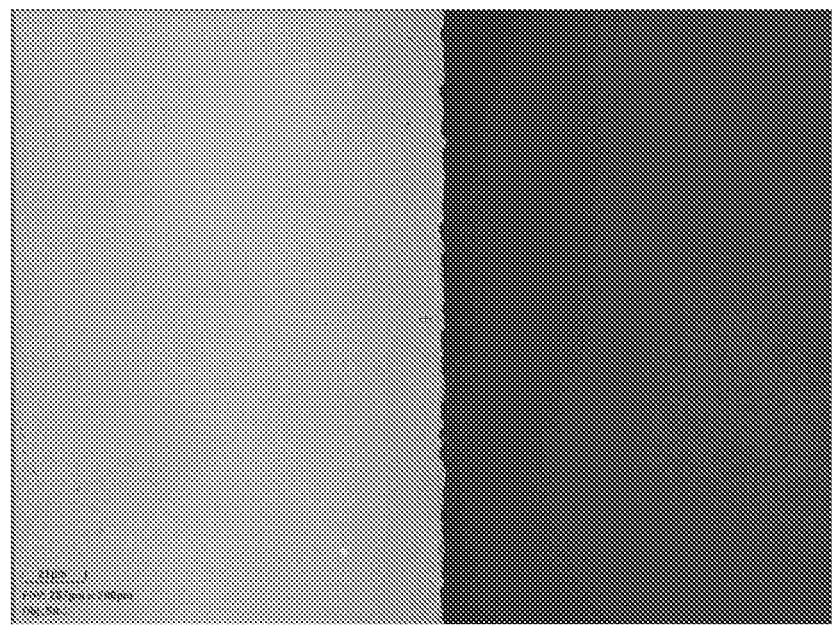
FIG. 2 is a side view of the sidewall of an etched trench.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not restrict the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Most semiconductor and MEMS substrates can be processed using thin film and thick film additive and subtractive processes. The subtractive processes use etching, milling, ion beam milling, lift off or other processes to remove material added to the substrate or from the substrate itself. Depending on the substrate the subtractive processes can be either quick or slow. Sapphire substrates are very hard (slow) to etch, ion beam mill or mill do to its hardness and inert nature of sapphire. Silicon substrates can be etched using chemical or plasma etching or ion beam milling. One of the more easily processed substrates is a photodefinable glass substrate.

Photodefinable glass materials are processed using first generation semiconductor equipment in a simple three step process where the final material can be fashioned into either glass, ceramic, or contain regions of both glass and ceramic. Photodefinable glass has several advantages for the fabrication of a wide variety of microsystems components, systems on a chip and systems in a package. Microstructures and electronic components have been produced relatively inexpensively with these types of glass using conventional semiconductor and printed circuit board (PCB) processing equipment. In general, glass has high temperature stability, good mechanical and electrical properties, and a better chemical resistance than plastics as well as many types of metals. When exposed to UV-light within the absorption band of cerium oxide, the cerium oxide acts as a sensitizer by absorbing a photon and losing an electron. This reaction reduces neighboring silver oxide to form silver atoms, e.g.,

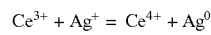

$$Ce^{3+} + Ag^+ = Ce^{4+} + Ag^0$$

The silver ions coalesce into silver nano-clusters during the heat treatment process and induce nucleation sites for the formation of a crystalline ceramic phase in the surrounding glass. This heat treatment must be performed at a temperature near the glass transformation temperature. The ceramic crystalline phase is more soluble in etchants, such as hydrofluoric acid (HF), than the unexposed vitreous, amorphous glassy regions. In particular, the crystalline [ceramic] regions of FOTURAN® are etched about 20 times faster than the amorphous regions in 10% HF, enabling microstructures with wall slope ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference. Other compositions of photodefinable glass will etch at different rates.

One method of fabricating a passive device or a combination of passive devices for form filters or other electronic or RF elements can use a photosensitive glass substrate—comprised of silica, lithium oxide, aluminum oxide and cerium oxide—involves the use of a mask and UV light to create a pattern with at least one, 2-dimensional or 3 dimensional, ceramic phase region within the photosensitive glass substrate.

Preferably, the shaped glass structure contains at least one or more, 2-dimensional or 3-dimensional inductive device. The capacitive device is formed by making a series of connected structures to form a high surface area capacitor for power condition. The structures can be either rectangular, circular, elliptical, fractal or other shapes that create a pattern that generates capacitance. The patterned regions of the APEX™ glass can be filled with metal, alloys, composites, glass or other magnetic media, by a number of methods including plating or vapor phase deposition. Once the passive devices have been generated, the supporting APEX™ glass can be left in place or removed to create an array of passive devices that can be detached in series or in parallel. Traditional series processes use laser, sawing water jet and other processes to cut through the substrate to release the die that contains the passive devices. A novel approach uses the basic properties of a photodefinable glass substrate to expose a hatched pattern that isolates each die, bake the photodefinable glass substrate to convert the exposed region to a ceramic phase, attach the photodefinable glass substrate to a backing that has a mild adhesive to support the wafer and or die, then etch troughs or trenches that complete the exposed hatched pattern down to the adhesive backing. This process isolates the individual die on the mild adhesive backing. The isolated die can be removed using traditional pick and place techniques and applied to reel-to-reel or other delivery systems.

The release pattern, materials and methods described can be used to make rectangular, circular, elliptical, fractal or another shape that mimics the shape of the passive device or combination of passive devices. This further allows for release of die shapes that would otherwise not be possible using traditional series processes such as laser, sawing water jet and other processes to cut through the substrate to release the die that contains the passive devices.

To address these needs, the present inventors developed a glass ceramic (APEX® Glass ceramic) as a novel packaging and substrate material for semiconductors, RF electronics, microwave electronics, and optical imaging. APEX® Glass ceramic is processed using first generation semiconductor equipment in a simple three step process and the final material can be fashioned into either glass, ceramic, or contain regions of both glass and ceramic. The APEX® Glass ceramic possesses several benefits over current materials, including: easily fabricated high density via, demonstrated microfluidic capability, micro-lens or micro-lens array, high Young's modulus for stiffer packages, halogen free manufacturing, and economical manufacturing. Photodefinable glasses have several advantages for the fabrication of a wide variety of microsystems components. Microstructures have been produced relatively inexpensively with these glasses using conventional semiconductor processing equipment. In general, glasses have high temperature stability, good mechanical and electrical properties, and have better chemical resistance than plastics and many metals. To our knowledge, the only commercially available Photodefinable glass is FOTURAN®, made by Schott Corporation and imported into the U.S. only by Invenios Inc. FOTURAN® comprises a lithium-aluminum-silicate glass containing traces of silver ions plus other trace elements specifically silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide (Sb2O3) or arsenic oxide ($As_2O_3$), silver oxide ($Ag_2O$) of 0.05-0.15% by weight, and cerium oxide ($CeO_2$) of 0.01-0.04% by weight. As used herein the terms "APEX® Glass ceramic", "APEX® glass" or simply "APEX®" is used to denote one embodiment of the glass ceramic composition of the present invention.

When exposed to UV-light within the absorption band of cerium oxide the cerium oxide acts as sensitizers, absorbing a photon and losing an electron that reduces neighboring silver oxide to form silver atoms, e.g.,

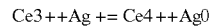

$$Ce3++Ag += Ce4++Ag0$$

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photodefinable glass," Microelectronic Engineering 30, 497 (1996), which is incorporated herein by reference.

Generally, glass ceramics materials have had limited success in microstructure formation plagued by performance, uniformity, usability by others and availability issues. Past glass-ceramic materials have yield etch aspect-ratio of approximately 15:1, in contrast APEX® glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX™ Glass ceramic this conversion is closer to 70%.

APEX® composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing.

Ceramicization of the glass is accomplished by exposing the entire glass substrate to approximately 20 $J/cm^2$ of 310 nm light. When trying to create glass spaces within the ceramic, users expose all of the material, except where the glass is to remain glass. In one embodiment, the present invention provides a quartz/chrome mask containing a variety of concentric circles with different diameters.

The present invention includes a method for fabricating an inductive device in or on glass ceramic structure for electrical microwave and radio frequency applications. The glass ceramic substrate may be a photosensitive glass substrate having a wide number of compositional variations including but not limited to: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; with the combination of B2O3; and Al2O3 not exceeding 13 weight %; 8-15 weight % $Li_2O$; and 0.001-0.1 weight % $CeO_2$. This and other varied compositions are generally referred to as the APEX® glass.

The exposed portion may be transformed into a crystalline material by heating the glass substrate to a temperature near the glass transformation temperature. When etching the glass substrate in an etchant such as hydrofluoric acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that has an aspect ratio of at least 30:1, and to create an inductive structure. The mask for the exposure can be of a halftone mask that provides a continuous grey scale to the exposure to form a curved structure for the creation of an inductive structure/device. A digital mask can also be used with the flood exposure and can be used to produce the creation of an inductive structure/device. The exposed glass is then baked, typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. Once the passive devices has been generated the supporting APEX™ glass can be left in place or removed to create an array of passive devices that can be detached in series or in parallel. Traditional series processes us laser, sawing water jet and other processes to cut through substrate to release the die that contains the passive devices. The invention exposes trench patterns into the photodefinable glass substrate that isolate each die, bake the photodefinable glass substrate to convert the exposed region to a ceramic phase, attach the photodefinable glass substrate to a backing that has a mild adhesive to support the wafer and or die, then etch troughs or trenches that complete the exposed hatched pattern down to the adhesive backing. This process isolates the individual die on the mild adhesive backing. The isolates the die can be removed using traditional pick and place techniques and applied to reel-to-reel or other delivery systems.

The described pattern can be either rectangular, circular, elliptical, fractal or another shape that mimics the shape of the passive device or combination of passive devices. This further allows for release of die shapes that would otherwise not be possible using traditional series processes such as laser, sawing water jet and other processes to cut through the substrate to release the die that contains the passive devices.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not restrict the scope of the invention.

The present invention includes capacitor, inductor, filters or other passive devices created in or on a photodefinable glass-ceramic substrate. Where the photodefinable glass-ceramic substrate has a hatch pattern of trenches that when etched releases the devices made in/on the photodefinable glass substrate. The photodefinable glass wafer can range in thickness from 50 μm to 1,000 μm. In one non-limiting case 400 μm. The photodefinable glass is then patterned with a trench structure in a hatch pattern.

First: expose the hatch pattern trench structure in the photodefinable glass using a 20 J/cm$^2$ of 310 nm light for a minimum of 2 minutes and a maximum of 10 minutes.

Second: The same mask that was used to produce the hatch pattern of trenches is used to create a negative photoresist pattern on the photodefinable glass substrate.

Third: The substrate is then placed into a sputtering system to deposit 1.0 μm of chrome metal.

Fourth: Remove the photoresist leaving a protective hard chrome mask over the hatch pattern of trenches.

Fifth: Process the photodefinable glass substrate to create a passive device or a system based on a passive device up to the bake cycle to convert the exposed regions to the nano phase ceramic. See 3DGS those taught in U.S. Pat. No. 10,201,091, "Photo-definable glass with integrated electronics and ground plane"; U.S. Pat. No. 10,070,533, "Photo-definable glass with integrated electronics and ground plane"; or U.S. Pat. No. 8,709,702, "Methods to fabricate a photoactive substrate suitable for microfabrication", relevant materials and/or methods and portions thereof incorporated herein by reference.

Sixth: The photodefinable glass substrate with the passive device is then baked, in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing lithium oxide to form around the silver nanoparticles.

Seventh: Finish creating the passive device or a system based on a passive device through metallization and passivation.

Eighth: Remove the chrome metal using a mixture of perchloric acid (HClO$_4$) and ceric ammonium.

Ninth: Attach a polyimide layer with a mild adhesive to the reverse side of the wafer photodefinable glass substrate.

Tenth: Etch the nanoceramic hatch pattern trench of the photodefinable glass substrate in an etchant of HF solution, typically 5% to 10% by volume, wherein the etch ratio of exposed portion to that of the unexposed portion is at least 30:1 exposed trench structure in a hatch pattern is etched through the volume of the glass.

Figure 3:
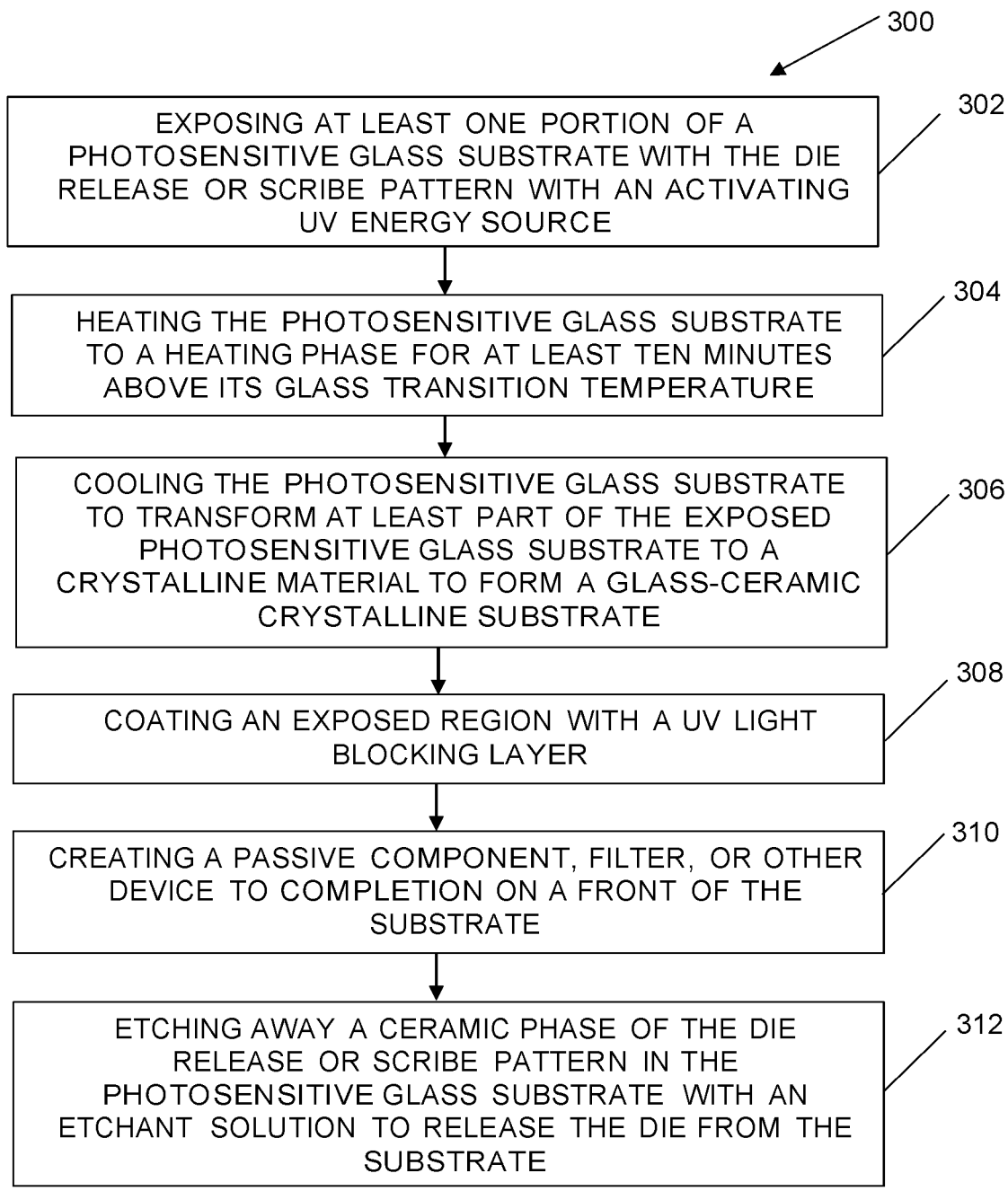
FIG. 3 shows a method of creating a die release or scribe pattern for one or more dies in parallel batch process from a substrate.

FIG. 3 shows a method 300 of creating a die release or scribe pattern for one or more dies in parallel batch process from a substrate. Block 302 shows the step of exposing at least one portion of a photosensitive glass substrate with the die release or scribe pattern with an activating UV energy source. The step of heating the photosensitive glass substrate to a heating phase for at least ten minutes above its glass transition temperature is shown in block 304, followed by block 306, which shows the step of cooling the photosensitive glass substrate to transform at least part of the exposed photosensitive glass substrate to a crystalline material to form a glass-ceramic crystalline substrate. The step of coating an exposed region with a UV light blocking layer is shown in block 308, and block 310 shows the step of creating a passive component, filter, or other device to completion on a front of the substrate. The step of etching away a ceramic phase of the die release or scribe pattern in the photosensitive glass substrate with an etchant solution to release the die from the substrate is shown in block 312.

The trench structure of the hatch pattern can range from 5 μm to 250 μm in diameter but preferable 30 μm in diameter. The length of the trench can transverse all or part of the width of the photo definable glass substrate. There is a slight texture to the etch surface texturing of the ceramic wall and a slight slope that is between 1° and 20° from vertical. The slope is due to the preferential etch rate (30:1 from the exposed region to the unexposed region) of the photodefinable glass. As the HF hits the unexposed region adjacent to the trench pattern the etchant will remove 1 μm laterally for every 30 μm vertically removed creating a slope and textures surface. This is opposed to using a cutting tool that grinds through the substrate at near vertical walls with a course/rough surface. Because of the width of the cutting/grinding blade/wheel the scribe or cut lines need to be greater than 100 μm. The width of the scribe or cut lines determines the total die count on the substrate. The thinner the scribe or cut lines, the closer the dies (more product per substrate) can be packed on the substrate. In certain embodiments of the present invention, the scribe lines are only 10, 20, 30, 40, 50, 60, 70, 75, 80, or 90 μm wide, or ranges in between each of these specific widths.

Thus, the present invention includes a method of batch massively parallel die release of a die from a substrate enabling low cost mass production of with passive, system in package (SiP) or system-in-a-package, or systems-on-chip (SoC), filters and/or other devices from a glass substrate.

In one embodiment, the present invention includes a method of creating a die release or scribe pattern for one or more dies in parallel batch process from a substrate comprising, consisting of, or consisting essentially of: exposing at least one portion of a photosensitive glass substrate with the die release or scribe pattern with an activating UV energy source; heating the photosensitive glass substrate to a heating phase for at least ten minutes above its glass transition temperature; cooling the photosensitive glass substrate to transform at least part of the exposed photosensitive glass substrate to a crystalline material to form a glass-ceramic crystalline substrate; coating an exposed region with a UV light blocking layer; creating a passive component, filter, or other device to completion on a front of the substrate; and etching away a ceramic phase of the die release or scribe pattern in the photosensitive glass substrate with an etchant solution to release the die from the substrate.

In one embodiment, the present invention includes a method of creating a die release or scribe pattern for one or more dies in parallel batch process from a substrate comprising, consisting of, or consisting essentially of: masking a photosensitive glass substrate with the die release or scribe pattern; exposing at least one portion of the photosensitive glass substrate as a die release with an activating UV energy source; heating the photosensitive glass substrate to a heating phase of at least ten minutes above its glass transition temperature; cooling the photosensitive glass substrate to transform at least part of the exposed photosensitive glass substrate to form a glass-ceramic crystalline portion of the photosensitive glass substrate; coating an exposed region with a UV light blocking layer; creating a passive component, filter, or other device to completion; placing a weakly adhesive backing to a back side of the substrate; etching away the glass-ceramic portion of the die release or scribe pattern in the photosensitive glass substrate with an etchant solution that releases the die; and removing the one or more dies from the weakly adhesive backing.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), properties(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of creating a die release or scribe pattern for one or more dies in parallel batch process from a substrate comprising:
 exposing at least one portion of a photosensitive glass substrate with the die release or scribe pattern with an activating UV energy source;

heating the photosensitive glass substrate to a heating phase for at least ten minutes above its glass transition temperature;

cooling the photosensitive glass substrate to transform at least part of the exposed photosensitive glass substrate to a crystalline material to form a glass-ceramic crystalline substrate;

coating an exposed region with a UV light blocking layer;

creating a passive component, filter, or other device to completion on a front of the substrate; and etching away a ceramic phase of the die release or scribe pattern in the photosensitive glass substrate with an etchant solution to release the die from the substrate.

2. The method of claim 1, wherein the die release or scribe pattern is a rectangular, circular, elliptical, fractal or another-shape that outlines a shape of the passive component, filter, or other device.

3. The method of claim 1, wherein the die release or scribe pattern is etched through to an adhesive backing.

4. The method of claim 1, wherein the die release or scribe pattern is greater than a structure that is 5 µm to 250 µm wide.

5. The method of claim 1, wherein the die release or scribe pattern has a greater number of dies per substrate than an equivalent substrate cut mechanically.

6. The method of claim 1, wherein an edge of the released die has a surface roughness less than 5 µm.

7. The method of claim 1, wherein an edge of the released die has a surface roughness less than 1 µm.

8. The method of claim 1, wherein an edge of the released die has a non-normal angle from a surface of the die.

9. The method of claim 1, wherein an edge of the released die has a non-normal angle from a surface of the die that is at least 1° and less than 30° from Normal to the surface of the die.

10. The method of claim 1, wherein a top or bottom corner of the released die has a non-normal curvature from a surface of the die that is at least 1° to less than 30° from a surface of the die.

11. The method of claim 1, wherein a width of one or more scribe lines is 10, 20, 30, 40, 50, 60, 70, 75, 80, or 90 µm wide, or ranges in between.

12. A method of creating a die release or scribe pattern for one or more dies in a parallel batch process from a substrate comprising:

masking a photosensitive glass substrate with the die release or scribe pattern;

exposing at least one portion of the photosensitive glass substrate as the die release or scribe pattern with an activating UV energy source;

heating the photosensitive glass substrate to a heating phase of at least ten minutes above its glass transition temperature;

cooling the photosensitive glass substrate to transform at least part of the exposed photosensitive glass substrate to form a glass-ceramic crystalline portion of the photosensitive glass substrate;

coating an exposed region with a UV light blocking layer;

creating a passive component, filter, or other device to completion on a front of the substrate;

placing a weakly adhesive backing to a back side of the substrate;

etching away the glass-ceramic portion of the die release or scribe pattern in the photosensitive glass substrate with an etchant solution that releases the die; and removing the one or more dies from the weakly adhesive backing.

13. The method of claim 12, wherein the die release or scribe pattern is a rectangular, circular, elliptical, fractal or another shape that outlines a shape of the passive component, filter, or other device.

14. The method of claim 12, wherein the die release or scribe pattern is a can etch to the adhesive backing.

15. The method of claim 12, wherein the die release or scribe pattern can be greater than structure that is 5 µm to 250 µm wide.

16. The method of claim 12, wherein the die release or scribe pattern enables a greater number of dies per substrate.

17. The method of claim 12, wherein an edge of the released die has a surface roughness less than 5 µm.

18. The method of claim 12, wherein an edge of the released die has a surface roughness less than 1 µm.

19. The method of claim 12, wherein an edge of the released die has a non-normal angle from a surface of the die.

20. The method of claim 12, wherein an edge of the released die has a non-normal angle from a surface of at least 1° and less than 30° from Normal to the surface of the die.

21. The method of claim 12, wherein a top or bottom corner of the released die has a non-normal curvature from the surface of at least 1° and less than 30° from the surface of the die.

22. The method of claim 12, wherein a width of one or more scribe lines is 10, 20, 30, 40, 50, 60, 70, 75, 80, or 90 µm wide, or ranges in between.

* * * * *